(12) United States Patent
Suzuki

(10) Patent No.: US 6,718,127 B2
(45) Date of Patent: Apr. 6, 2004

(54) HEATING DEVICE OF THE LIGHT IRRADIATION TYPE

(75) Inventor: Shinji Suzuki, Kanagawa (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/222,853

(22) Filed: Aug. 19, 2002

(65) Prior Publication Data

US 2003/0038128 A1 Feb. 27, 2003

(30) Foreign Application Priority Data

Aug. 21, 2001 (JP) ........................................ 2001-250258

(51) Int. Cl.⁷ .............................................. F26B 19/00
(52) U.S. Cl. ...................... 392/416; 392/418; 392/408; 392/422; 392/411; 392/420; 392/419; 219/390; 219/405; 219/411; 118/724; 118/725; 118/501
(58) Field of Search ................................. 219/390, 405, 219/411; 392/408, 411–413, 418, 419–420, 422–423, 416; 250/504 R, 495.1; 118/724, 725, 50.1

(56) References Cited

U.S. PATENT DOCUMENTS

| | | | |
|---|---|---|---|
| 4,832,777 A | * | 5/1989 | Davis et al. ................ 156/345 |
| 4,859,832 A | | 8/1989 | Uehara et al. |
| 5,889,258 A | * | 3/1999 | Lubomirski et al. ........ 219/405 |
| 6,300,601 B1 | | 10/2001 | Suzuki |
| 2001/0007405 A1 | | 7/2001 | Suzuki |

* cited by examiner

Primary Examiner—Shawntina Fuqua
(74) Attorney, Agent, or Firm—Nixon Peabody LLP; David S. Safran

(57) ABSTRACT

A heating device of the light irradiation type in which uniform illuminance can be obtained without placing a single end lamp in the middle of the light source part is achieved providing a light source part in which circular lamps are arranged concentrically to one another with a mirror in the center of the circular lamps. The mirror is convex toward the workpiece and reflects the light emitted from the innermost circular lamp located closest to the center area so that, without placing a single end lamp in the middle area, the reduction of illuminance in the middle area of the irradiated surface is reduced. Furthermore, the reflector can be made conical, and in this way, the light from the lamps can be emitted with high efficiency onto the workpiece surface.

7 Claims, 8 Drawing Sheets single end lamp internal diameter

HEATING DEVICE OF THE LIGHT IRRADIATION TYPE

BACKGROUND OF THE INVENTION

1. Field of the Invention

The invention relates to a heating device of the light irradiation type in which a semiconductor wafer (hereinafter called a wafer) is quickly heated for layer formation, diffusion, annealing or for similar purposes, kept at a high temperature, and then quickly cooled.

2. Description of Related Art

Heat treatment of the light irradiation type in the production of semiconductors, such as layer formation, diffusion, annealing or the like, is carried out in a wide range. In each of these treatments, a wafer is heated to a high temperature. If a heating device of the light irradiation type is used for this heat treatment, the wafer can be quickly heated and its temperature increased up to at least 1000° C. in a few seconds to a few dozen seconds. When light irradiation is stopped, it can be quickly cooled. But, if a nonuniform temperature distribution occurs in the wafer when it is heated, a phenomenon called slip arises in the wafer, i.e., a dislocation fault. Here, there is the danger of formation of scrap. Therefore, it is necessary in the heat treatment of the wafer using a heating device of the light irradiation type to carry out heating, keeping at a high temperature and cooling such that the temperature distribution of the wafer is made uniform.

Furthermore, in the case of heating for layer formation on the wafer, the latter must be heated with a high degree of uniformity of illuminance within the surface in order to form a layer with a uniform thickness.

FIG. 9 shows a conventional optical heating device in cross section. Here, in a light source part 1, there are filament lamps L2 to L10, countersunk, with circular arc tubes in which a filament for emission is located. FIG. 10 shows one arc tube. In the middle of the light source part is a lamp L1 with a unilateral hermetic seal (single end type). In the chamber 2, there is a holding frame 3 on which a workpiece to be subjected to heat treatment, such as a semiconductor wafer W or the like, is placed. The lamps L2 to L10 and the chambers 2 are separated from one another, for example, by a quartz window 4 or the like.

FIG. 11 is a schematic in which the light source part is viewed from the side of the workpiece (wafer). Here, there are several lamps with different annular diameters arranged concentrically relative to one another.

The lamps used here can also be made circular by combining two, or more than two, arc-shaped arc tubes with one another, as is shown in FIG. 12. FIG. 13 is a schematic in which the light source part in which lamps with arc-shaped arc tubes are arranged combined with one another is viewed from the side of the workpiece (wafer). In the middle area of the light source part, i.e., in the middle of the concentric circles of the circular or arc-shaped lamps (hereinafter both types are called "circular lamps"), there is no lamp. If this state remains unchanged, the illuminance of the light with which the middle area of the workpiece is irradiated is reduced. Therefore, as shown in FIG. 9, there is a lamp L1 with a unilateral hermetic seal (single end type) in essentially the center area, and thus, the reduction of illuminance is equalized.

The irradiance of the single end lamp L1 located in the middle must be the same as the irradiance of the circular lamp L2 and the like located in the vicinity. The lamp of the single end type, however, has a smaller diameter filament than the circular lamps. Therefore, if the same wattage is supplied in order to make the irradiance of the single end lamp and that of the circular lamps the same, in the single end lamp, the filament burns through earlier than in the circular lamps. That is, in the lamp with the unilateral hermetic seal, the service life is shorter than in the circular lamps. The reason why the filament diameter of the lamp with the unilateral hermetic seal differs from the filament diameter of the circular lamps is the following:

As is shown in FIG. 14(a), the single end lamp has an arrangement in which a filament 21 is bent within a bulb 20. The diameter of the filament 21 is reduced to prevent the bent filament 21 from touching the windings and thus being short circuited. In the case of a circular lamp, as shown above in FIGS. 10 & 12, the filament is not bent. Therefore, as shown in FIG. 14(b), the diameter of the filament can be increased. The lamp service life (duration of illumination until the filament burns through) in the single end lamp is, for example, roughly 500 hours, while the service life of the circular lamp is roughly 2000 hours.

Since the service life of the single end lamp L1 which is located in the middle area is shorter than the service life of the other circular lamps, for replacement of the single end lamp L1, the device must be frequently stopped (roughly every 500 hours). To prevent frequent stopping of the device, it would be better not to use the single end lamp any longer. If this lamp is eliminated, however, the illuminance of the middle area on the irradiated surface is reduced, by which the distribution of illuminance is degraded and by which uniform heating of the entire surface of the wafer can no longer be performed.

SUMMARY OF THE INVENTION

The invention was devised to eliminate the aforementioned disadvantages in the prior art. Thus, a primary object of the invention is to devise a heating device of the light irradiation type in which uniform illuminance can be obtained without placing a single end lamp in the middle of the light source part.

The object is achieved as claimed in the invention as follows:

(1) In the above described heating device of the light irradiation type, in the middle area of the light source part, instead of a single end lamp, there is a reflector which is convex in the workpiece direction and which reflects the light from a filament lamp which is located on the innermost side in the direction to the middle area of the workpiece. In this way the light which is emitted from the innermost circular lamp can be reflected by the above described mirror in the direction to the middle area of the workpiece and the reduction in illuminance on the workpiece surface can be equalized.

(2) The above described reflector is formed preferably conically. In this way, the light from the lamps can be uniformly emitted onto the workpiece surface.

(3) Preferably d<2L, where L is the diameter of the innermost filament lamp and d is the distance between the middle of this filament lamp and the workpiece.

By virtue of the above described measure that d<2L, the action can be obtained that the illuminance is especially well equalized by the conical mirror. Especially, by the measure that the temperature of the middle area of the workpiece can approach the desired temperature.

The invention is explained in detail below using several embodiments shown in the drawings.

DETAILED DESCRIPTION OF THE INVENTION

Figure 1:
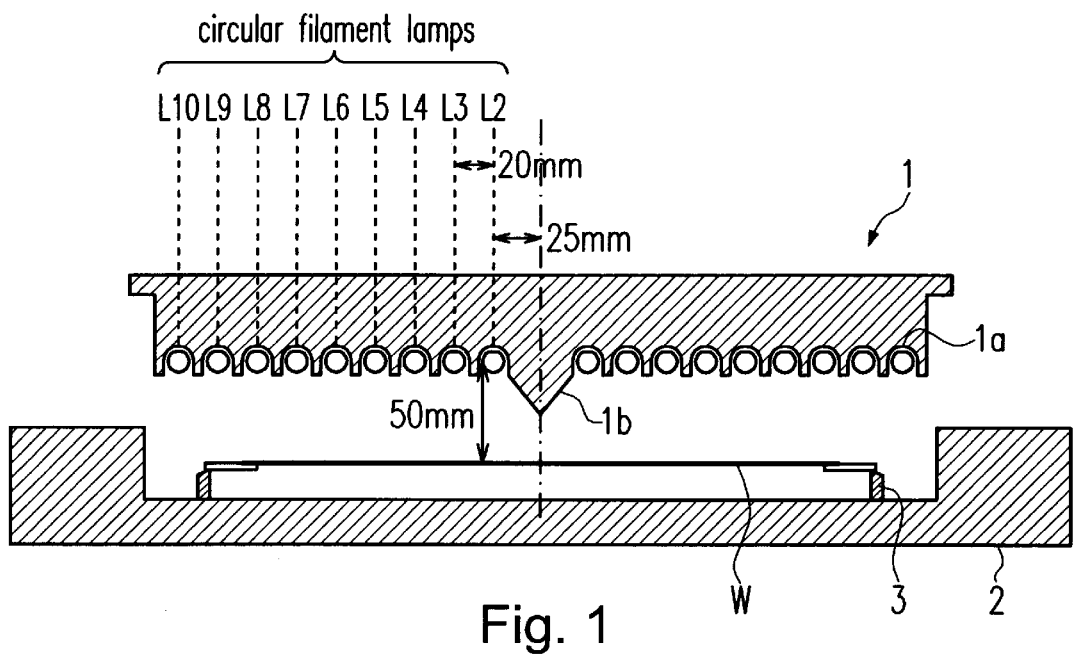
FIG. 1 shows a schematic of the cross-sectional arrangement of one embodiment of a heating device of the light irradiation type in accordance with the invention.
Figure 11:
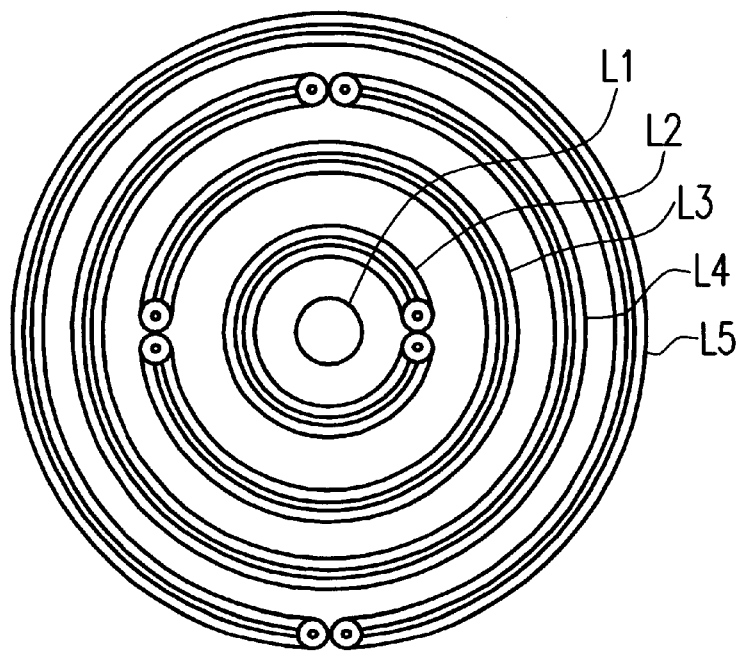
FIG. 11 shows a schematic in which in the case of using the lamp as shown in FIG. 10 the light source part of FIG. 9 as viewed from the workpiece side.
Figure 12:
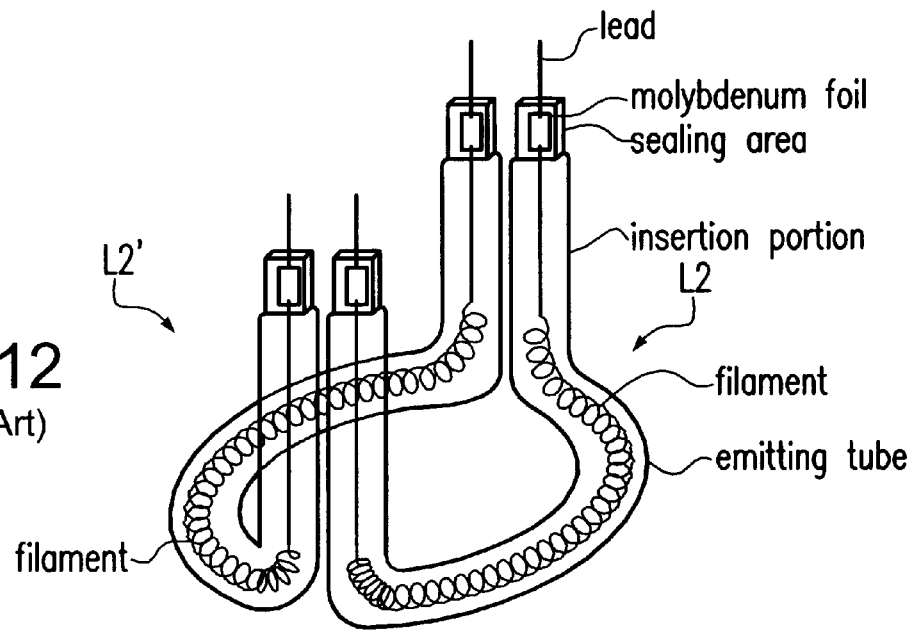
FIG. 12 shows a schematic of the known case of using two circular filament lamps.
Figure 13:
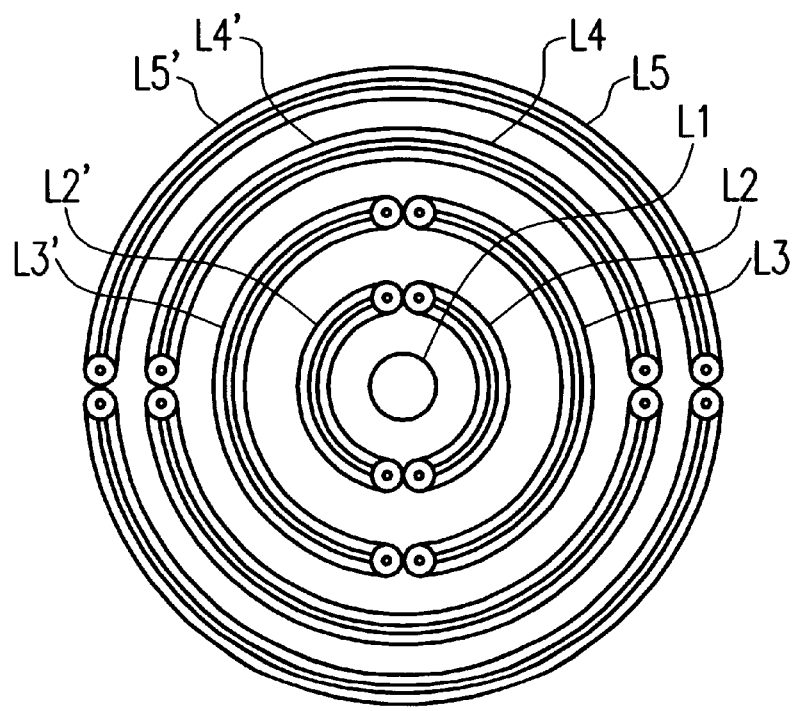
FIG. 13 shows a schematic in which in the case of using the lamps as shown in FIG. 13, the light source part is viewed from the workpiece side.
Figure 14A:
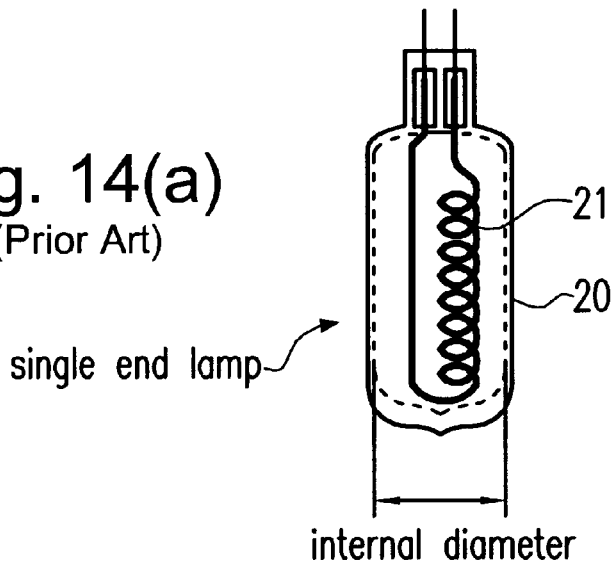
FIGS. 14(a) & 14(b) each show a schematic of one example of the arrangement of a conventional single end lamp and a known circular lamp.
Figure 14B:
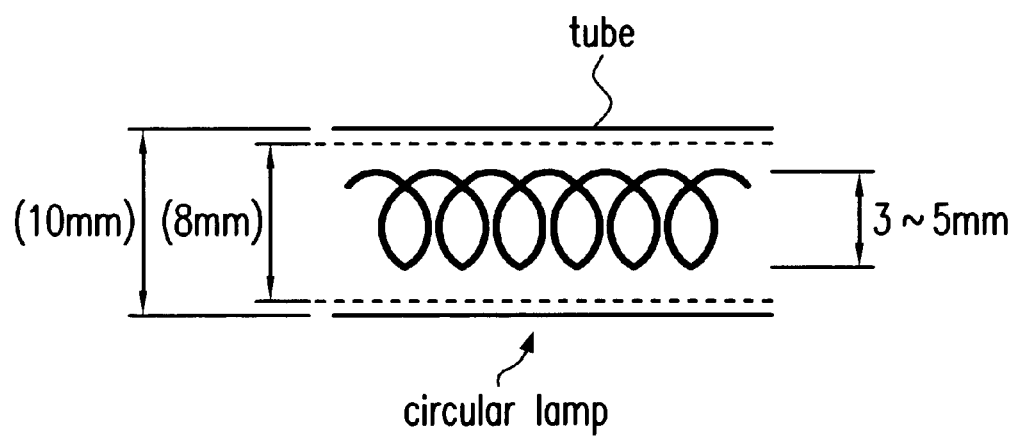

FIG. 1 shows a cross section of one embodiment of a heating device of the light irradiation type according to the invention which has circular lamps L2 to L10 arranged concentrically with respect to one another in the light source part 1, as was described above with respect to FIGS. 11 & 13. In the middle of the circular lamps L2 to L10, on the workpiece side, there is a convex mirror 1b. On the backs of the lamps L2 to L10 there are mirrors 1a. In the chamber 2, there is a holding frame 3 on which a workpiece to be heated, such as a semiconductor wafer W or the like, is placed.

In this embodiment, as was described above, in the middle of the circular lamps L2 to L10, on the workpiece side, there is a convex mirror. Therefore, the illuminance in the middle area of the irradiated surface can be increased without placing a single end lamp in the middle area.

Figure 2:
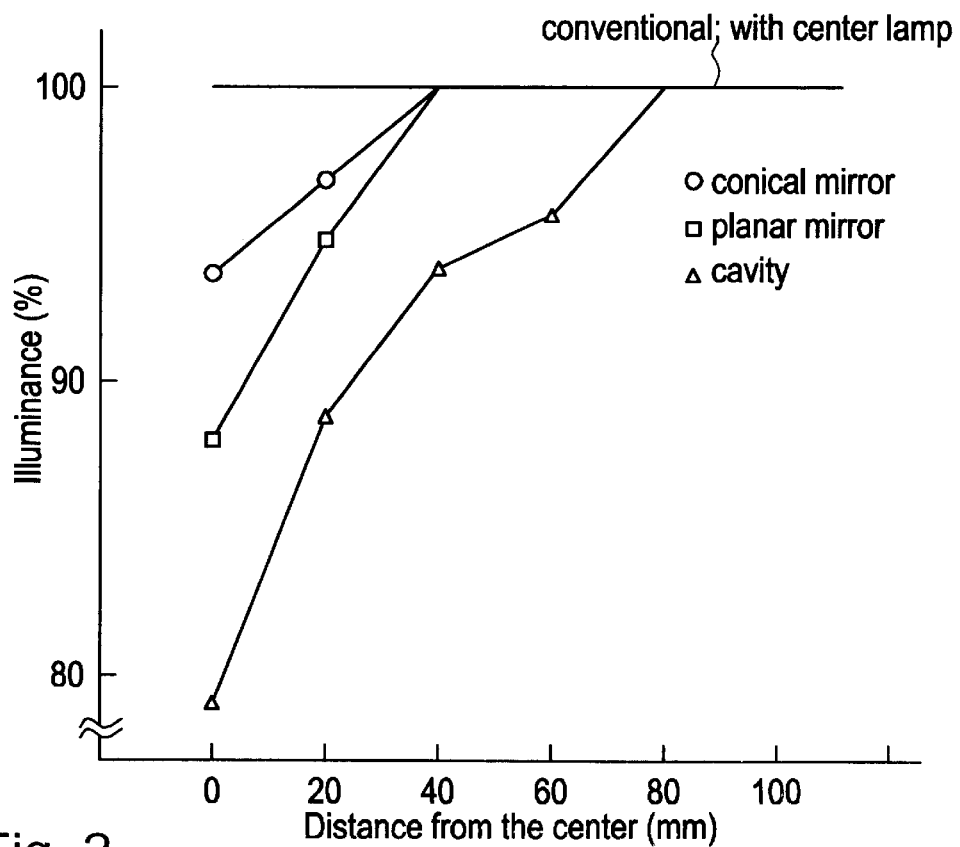
FIG. 2 graph representing the demonstrated results of the illuminance of the middle area of the irradiated surface in the case of arrangement of three types of mirrors in the middle area.

It was studied how the illuminance of the middle area on the irradiated surface is influenced by the presence of the mirror 1b in the middle area. The demonstrated result, which is shown in FIG. 2, is described below. In FIG. 2, in the conventional device shown in FIG. 9 (single end lamp present in middle), the illuminance on the wafer surface was computed at the position 100 mm away from the middle, this value was labeled 100% and the illuminance on the wafer surface was determined under the following respective conditions (1) to (3).

Figure 9:
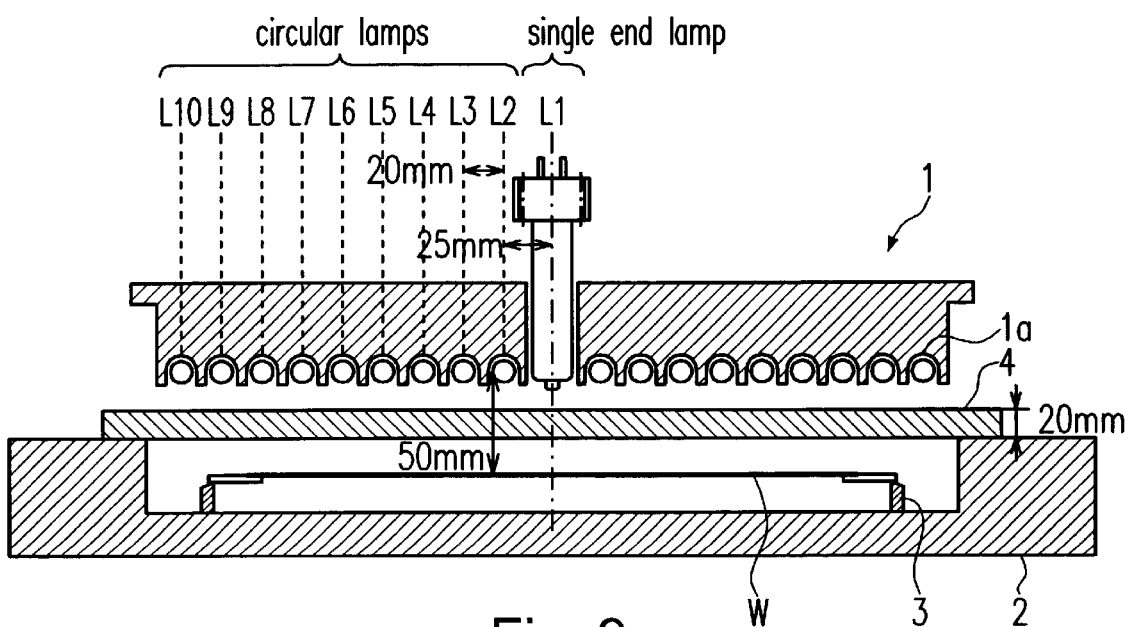
FIG. 9 is a schematic of the cross-sectional arrangement of a conventional heating device of the light irradiation type.
Figure 10:
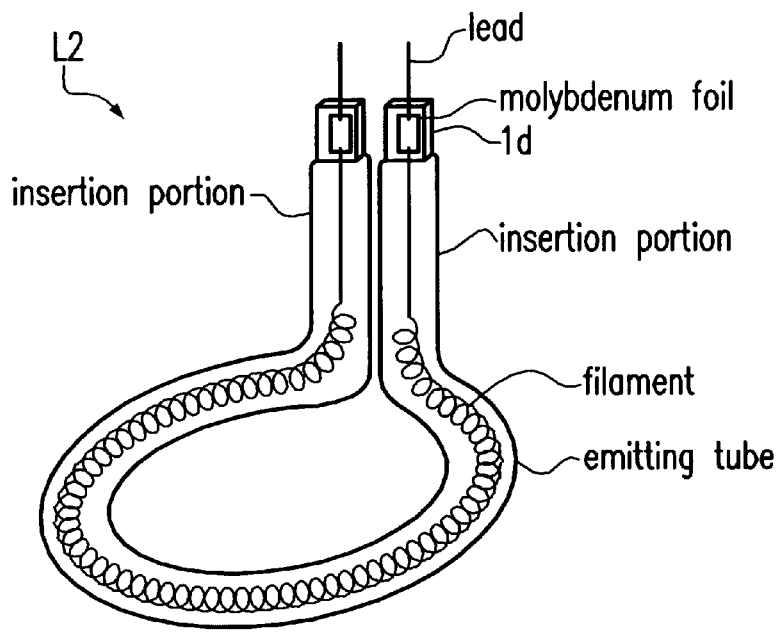
FIG. 10 shows a schematic of one example of a known circular filament lamp.

(1) In the device shown in FIG. 9, the single end lamp has been eliminated (the area from which the lamp was removed is a cavity).

Figure 3:
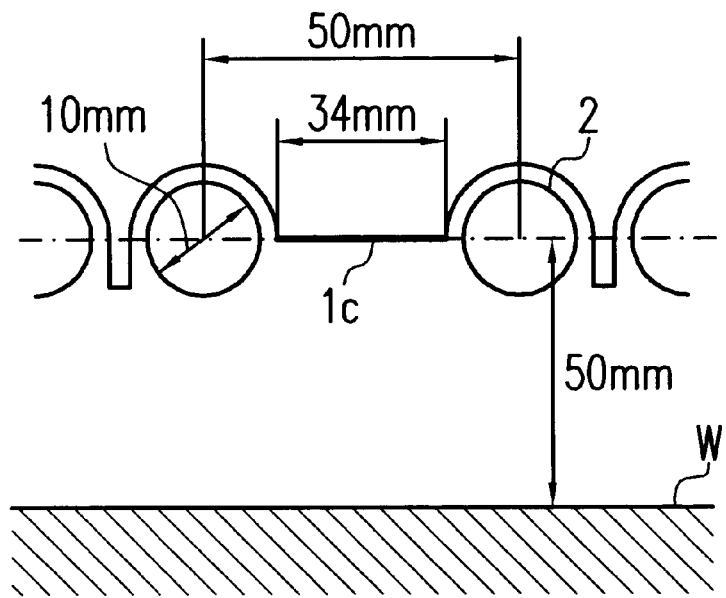
FIG. 3 shows a schematic of the case in which a cavity which has been formed by eliminating the single end lamp has been replaced by a planar mirror.

(2) A planar mirror 1c is inserted into the cavity which was formed by removing the lamp shown in FIG. 3.

Figure 4:
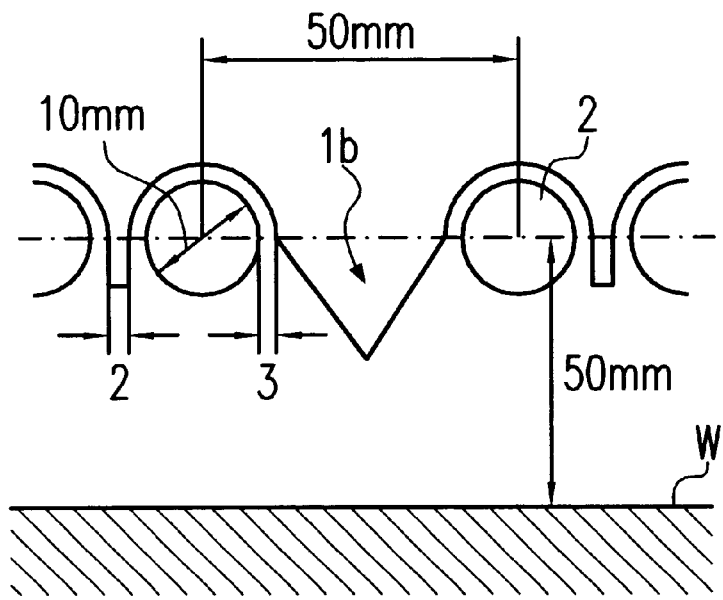
FIG. 4 shows a schematic of the case in which a conical mirror is located in a cavity which was formed by eliminating the single end lamp.

(3) In the cavity which was formed by removing the lamp, instead of the planar mirror 1c shown in FIG. 3, there is a conical mirror 1b, as shown in FIG. 4.

In the above described cases, the illuminance was computed and the values were displayed. This computation was carried out with consideration of the illuminance of the circular lamps L2, L3, and L4.

The result of computation of the illuminance with the same conditions except for the distance of the middle lamp from the conventional device is shown using the symbols in legend of FIG. 2. In case (1), shown with the triangle symbols, the mirror surface which was formed by eliminating the lamp forms a cavity. The illuminance has not changed at the points which are around 100 mm and 80 mm from the middle; but, the illuminance was reduced to 96% at the position which is around 60 mm away and in the middle it was reduced to 79%.

The result of computation of the illuminance with the same conditions except for the cover of the cavity shown in FIG. 3 which was formed by eliminating the lamp is shown with a planar mirror in FIG. 2 (the above described case (2)) by the square symbol. The illuminance has not changed at the points which are around 100 mm to 40 mm away from the middle compared to the case of a conventional device. However, the illuminance was reduced to 95% at the position which is around 20 mm away, and in the middle, it was reduced to 89%.

The result of computation of the illuminance with the same conditions except that, instead of the planar mirror 1c shown in FIG. 3, a conical mirror 1b as shown in FIG. 4 (the above described case (3)) was used and is shown in FIG. 2 using circle symbols. The angle of incline of the cone was set such that the light from the lamp L2 is reflected in the direction towards the middle of the workpiece. The illuminance did not change at the points which are around 100 mm to 40 mm from the middle as compared to the case of a conventional device. The illuminance was reduced to 97% at the position which is around 20 mm away, and in the middle it was reduced to 94%.

As is apparent from FIG. 2, in the case shown in FIG. 4, the reduction of the illuminance of the middle area was reduced to less than or equal to 10%. When the reduction of illuminance is within 10%, by controlling the wattages of the inside, circular lamps L2, L3 and the like and by changing the irradiance (a balance adjustment) the uniformity of the distribution of illuminance can be corrected roughly to the same degree as the conventional degree.

Figure 5A:
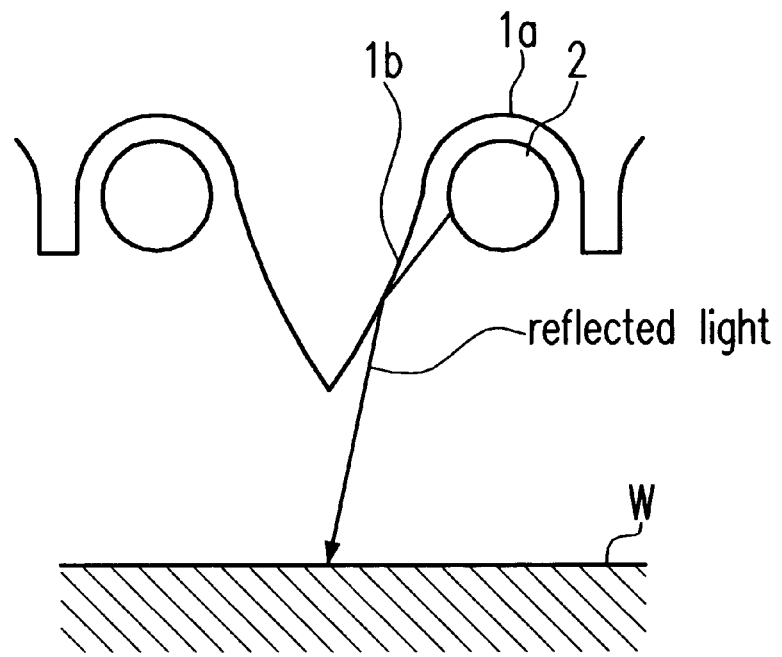
FIGS. 5(a) & 5(b) each show a schematic of a modified version of the arrangement shown in FIG. 4.
Figure 5B:
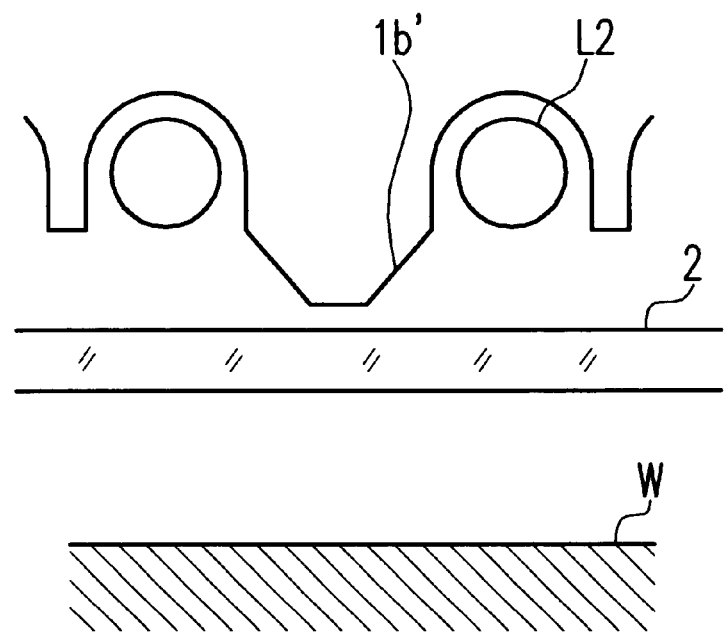

In FIG. 4, the reflection surface of the conical reflector 1b and the groove of the mirror in which the lamp is located are not matched to one another. However, they can also be arranged passing into one another with a smooth transition, as is shown in FIG. 5(a). Furthermore, as shown in FIG. 5(b), the tip of the conical mirror can be cut off so that the conical mirror does not come into contact with the quartz plate located between the workpiece and the lamps (see FIG.

Figure 6A:
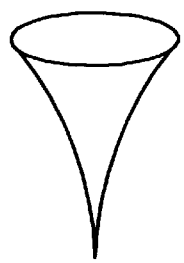
FIGS. 6(a) & 6(b) each show a schematic of another example of a reflector which is convex in the workpiece direction.
Figure 6B:
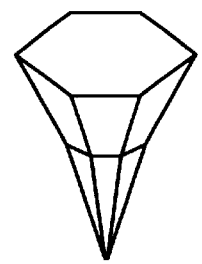

1). If there is no restriction with respect to the construction of the device, it is more desirable to form the mirror in a complete conical shape because, in this way, the reflection efficiency of the light becomes higher. The shape of the reflector is not limited to the conical shape. As shown in FIG. 6(a), it can be a conical shape which is concave, or as is shown in FIG. 6(b), the reflection surface can be formed as a polyhedron.

The smaller the distance between the middle of the lamp and the workpiece, the greater the action of equalizing the reduction in illuminance of the middle area of the workpiece by the reflector which projects toward the workpiece side.

Figure 7:
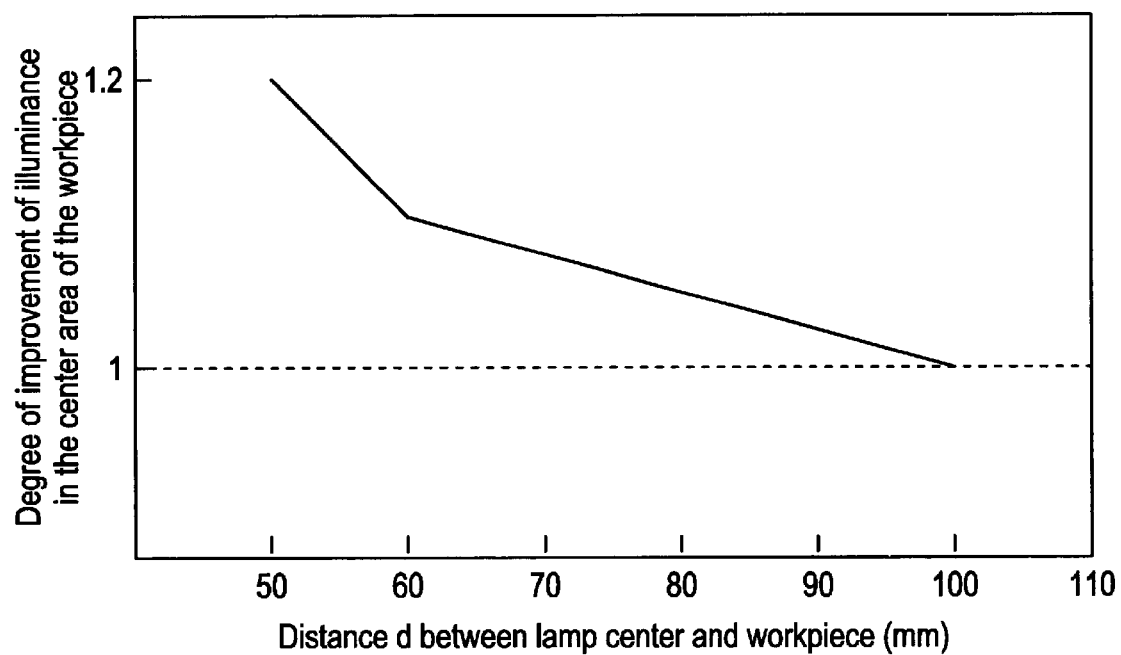
FIG. 7 is a graph showing the relationship between the degree of improvement of the illuminance of the middle area of the workpiece and the distance between the lamp center and the workpiece.

FIG. 7 shows the relationship between the degree of improvement of the illuminance of the middle area of the workpiece and the distance (distance between the middle of the lamp and the workpiece). In the figure, the y axis plots the degree of improvement of the illuminance of the middle area of the workpiece in an arrangement of the conical mirror (the illuminance of the middle area of the workpiece at the distance of the middle lamp is labeled 1 and the ratios thereof are shown). The x-axis plots the distance d between the middle of the lamp and the workpiece. FIG. 7 is a graphic representation which was determined at a diameter of the lamp L2 which is located farthest inside, 50 mm. This shows that at a distance d between the middle of the lamp and the workpiece of less than 100 mm the illuminance of the middle area of the workpiece was more clearly improved compared to the case of removing the middle lamp.

Figure 8:
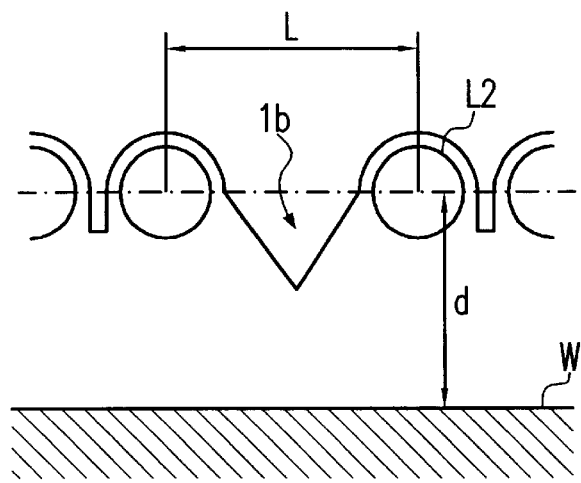
FIG. 8 shows a schematic showing the distance between the lamp center and the workpiece and diameter of the diameter of the innermost filament lamp.

Therefore in the case of d<2L an especially good effect of equalization of the illuminance by the conical mirror can be obtained, L (mm) being the diameter of the innermost lamp L2 and d (mm) the distance between the middle of the lamp L2 and the workpiece, as is shown in FIG. 8. If especially in the case of where there is no reflector, the middle area of the workpiece is reduced by 20° C. to 30° C. with respect to setting of a temperature of 1000° C. On the other hand, by the arrangement of the reflectors described above using FIG. 4, the temperature of the middle area approaches the set temperature. Furthermore, by controlling the wattages of the circular lamps L2, L3 and the like and by changing the irradiance (balance adjustment), the reduction of the temperature of the middle area can be almost completely eliminated.

Action of the Invention

As was described above, the following effects can be obtained as claimed in the invention:

(1) By placing the reflector which has an overall shape that is convex in the direction of the workpiece in the middle area of the light source which reflects the light from the filament lamp located farthest inside in the direction to the middle area of the workpiece, without placing a single end lamp in the middle area, deterioration of the distribution of the illuminance can be prevented. Therefore, it is not necessary to use a single end lamp with a short service life. The length of stoppage of the optical heating device can be shortened.

(2) By using a conical mirror as a reflector and by the measure that d<2L, deterioration of the distribution of the illuminance can be effectively prevented, L being the diameter of the innermost filament lamp and d being the distance between the middle of this filament lamp L2 and the workpiece.

What is claimed is:

1. Heating device of the light irradiation type with a light source part in which several filament lamps with circular or arc-shaped arc tubes are located in concentric rings, and which has mirror surfaces which reflect light emitted from the filament lamps in a direction toward a workpiece so that the workpiece is heated, wherein a reflector is provided in a center area of the light source part, the reflector projecting in the direction toward the workpiece and being configured to reflect the light from an innermost one of the filament lamps which is located closest to the center area of the light source part; wherein the innermost filament lamp is sized and positioned so as to satisfy the relationship d<2L, where L is a diameter of the innermost filament lamp measured between opposite center points of an the arc tube of the innermost filament lamp and d is a distance between the workpiece and a middle plane which runs through the arc tube of the filament lamp essentially parallel to the workpiece.

2. Heating device of the light irradiation type as claimed in claim 1, wherein the reflector is essentially conical.

3. Heating device of the light irradiation type as claimed in claim 1, wherein the reflector is essentially in the shape of a truncated cone.

4. Heating device of the light irradiation type with a light source part in which several filament lamps with circular or arc-shaped arc tubes are located in concentric rings, and which has mirror surfaces which reflect light emitted from the filament lamps in a direction toward a workpiece so that the workpiece is heated, wherein a reflector is provided in a center area of the light source part, the reflector projecting in the direction toward the workpiece and being configured to reflect the light from an innermost one of the filament lamps which is located closest to the center area of the light source part; wherein the reflector is essentially conical; and wherein the innermost filament lamp has a distance d between the workpiece and a middle plane which runs through the arc tube essentially parallel to the workpiece which is less than twice a diameter L of the innermost filament lamp measured between the opposite center points of the arc tube of the innermost filament lamp.

5. Heating device of the light irradiation type with a light source part in which several filament lamps with circular or arc-shaped arc tubes are located in concentric rings, and which has mirror surfaces which reflect light emitted from the filament lamps in a direction toward a workpiece so that the workpiece is heated, wherein a reflector is provided in a center area of the light source part, the reflector projecting in the direction toward the workpiece and being configured to reflect the light from an innermost one of the filament lamps which is located closest to the center area of the light source part wherein the reflector is essentially in the shape of a truncated cone; and wherein the innermost filament lamp has a distance d between the workpiece and a middle plane which runs through the arc tube essentially parallel to the workpiece which is less than twice a diameter L of the innermost filament lamp measured between the opposite center points of the arc tube of the innermost filament lamp.

6. Heating device of the light irradiation type as claimed in claim 1, wherein the reflector is essentially in the shape of a cone with a concave reflection surface.

7. Heating device of the light irradiation type as claimed in claim 1, wherein the reflector is essentially in the shape of a conic polyhedron.

* * * * *